(12) United States Patent
Ho et al.

(10) Patent No.: US 6,184,138 B1
(45) Date of Patent: Feb. 6, 2001

(54) METHOD TO CREATE A CONTROLLABLE AND REPRODUCIBLE DUAL COPPER DAMASCENE STRUCTURE

(75) Inventors: Paul Kwok Keung Ho; Mei Sheng Zhou; Subhash Gupta, all of Singapore (SG)

(73) Assignee: Chartered Semiconductor Manufacturing Ltd., Singapore (SG)

( * ) Notice: Under 35 U.S.C. 154(b), the term of this patent shall be extended for 0 days.

(21) Appl. No.: 09/390,782

(22) Filed: Sep. 7, 1999

(51) Int. Cl.[7] .................... H01L 21/44; H01L 21/4763
(52) U.S. Cl. ............... 438/687; 438/631; 438/633; 438/638; 438/643
(58) Field of Search .................. 438/687, 688, 438/631, 633–640, 642–645, 647, 652–654, 678, 685

(56) References Cited

U.S. PATENT DOCUMENTS

| | | | |
|---|---|---|---|
| 5,183,795 | 2/1993 | Ting et al. | 437/230 |
| 5,674,787 | 10/1997 | Zhao et al. | 437/230 |
| 5,686,337 | 11/1997 | Koh et al. | 437/52 |
| 5,705,430 | 1/1998 | Avanzino et al. | 437/195 |
| 5,817,572 | 10/1998 | Chiang et al. | 438/624 |
| 6,093,966 | * 7/2000 | Venkatraman et al. | 257/751 |

* cited by examiner

Primary Examiner—Richard Booth
Assistant Examiner—Ha Tran Nguyen
(74) Attorney, Agent, or Firm—George O. Saile; Rosemary L. S. Pike

(57) ABSTRACT

A new method is provided to construct a copper dual damascene structure. A layer of IMD is deposited over the surface of a substrate. A cap layer is deposited over this layer of IMD, the dual damascene structure is then patterned through the cap layer and into the layer of IMD. A barrier layer is blanket deposited, a copper seed layer is deposited over the barrier layer. The dual damascene structure is then filled with a spin-on material. The barrier layer and the copper seed layer are removed above the cap layer; the cap layer can be partially removed or can be left in place. The spin on material remains in place in the via and trench opening during the operation of removing the copper seed layer and the barrier layer from above the cap surface thereby protecting the inside surfaces of these openings. The spin-on material is next removed from the dual damascene structure and copper is deposited. The cap layer that is still present above the surface of the IMD protects the dielectric from being contaminated with copper solution during the deposition of the copper. The excess copper is removed using a touch-up CMP. The cap layer over the surface of the IMD can, after the copper has been deposited, be removed if this is so desired. As a final step in the process, a liner or oxidation/diffusion protection layer is deposited over the dual damascene structure and its surrounding area.

13 Claims, 3 Drawing Sheets

METHOD TO CREATE A CONTROLLABLE AND REPRODUCIBLE DUAL COPPER DAMASCENE STRUCTURE

BACKGROUND OF THE INVENTION (1) Field of the Invention

The invention relates to the fabrication of integrated circuit devices, and more particularly, to a method for reducing dishing and erosion effects in the copper surface of copper dual damascene structures.

(2) Description of the Prior Art

In the formation of semiconductor integrated circuits, it is common practice to form interconnect metal line structures on a number of different levels within the structure and interconnecting the various levels of wiring with contact or via openings. The first or lowest level of interconnect wires is typically formed as a first step in the process after which a second or overlying level of interconnect wires is deposited over the first level. The first level of interconnect wires is typically in contact with active regions in a semiconductor substrate but is not limited to such contact. The first level of interconnect can for instance also be in contact with a conductor that leads to other devices that form part of a larger, multi-chip structure. The two levels of metal wires are connected by openings between the two layers that are filled with metal where the openings between the two layers are lines up with and match contact points in one or both of the levels of metal lines.

Previously used techniques to form multi-levels of wiring apply the technique of first forming the interconnect level metal in a first plane followed by forming the overlying level of interconnect wire in a second plane. This structure typically starts with the surface of a semiconductor substrate into which active devices have been created. These active devices can include bipolar transistors, MOSFET devices, doped regions that interconnect with other regions of the device while provisions may also have been provided to make interconnects with I/O terminals in the periphery of the device. The surface into which the pattern of interconnect lines of the first plane is formed may also be an insulation layer deposited over the surface of the substrate or a layer of oxide may first have been formed on the surface of the substrate. After the layer, into which the pattern of interconnecting wires has to be created, has been defined, the interconnecting pattern itself needs to be defined. This is done using conventional photolithographic techniques whereby the openings are made (in the layer) above the points that need to be contacted in the substrate. The openings, once created, may by lined with layers of material to enhance metal adhesion (to the sidewalls of the opening), the glue layer, or to prevent diffusion of materials into and from the substrate in subsequent processing steps, the barrier layer. For the barrier layer, a variety of materials can be used such as Ti/Tin:W (titanium/titanium nitride:tungsten), titanium-tungsten/titanium or titanium-tungsten nitride/ titanium or titanium nitride or titanium nitride/titanium, silicon nitride ($Si_3N_4$), tungsten, tantalum, niobium, molybdenum. The final phase in creating the first level of interconnect lines is to fill the created openings with metal, typically aluminum, tungsten or copper, dependent on the particular application and requirements and restrictions imposed by such parameters as line width, aspect ratio of the opening, required planarity of the surface of the deposited metal and others.

This process of line formation in overlying layers on metal can be repeated in essentially the same manner as just highlighted for the first layer of interconnecting wires. This process of forming sequential layers of interconnecting levels of wire is in many instances prone to problems and limitations. Copper has in recent times found more application in the use of metal wires due to its low resistivity, high electromigration resistance and stress voiding resistance. Copper however exhibits the disadvantage of high diffusivity in common insulating materials such as silicon dioxide and oxygen-containing polymers. This leads to, for instance, the diffusion of copper into polyimide during high temperature processing of the polyimide resulting in severe erosion of the copper and the polyimide due to the copper combining with oxygen in the polyimide. The erosion may result in loss of adhesion, delamination, voids, and ultimately a catastrophic failure of the component. The copper that is used in an interconnect may diffuse into the silicon dioxide layer causing the dielectric strength to become conductive and also decreasing the dielectric strength of the silicon dioxide layer. A copper diffusion barrier is therefore often required; silicon nitride is often applied as a diffusion barrier to copper. Silicon nitride however has a dielectric constant that is high compared to silicon dioxide thereby limiting the use of silicon nitride in encapsulating copper interconnect lines.

In addition, due to the fact that copper is very difficult to process by RIE, the CMP method may need to be used where copper is used as a wiring material. To polish copper at a high rate without scratching in accordance with the buried wiring formation, the copper etch rate must be raised by increasing the amount of the component responsible for copper etching contained in the polishing slurry. If the component is used in an increased amount, the etching will occur isotropically. Consequently, buried copper is etched away, causing dishing in the wiring. It is, when forming interconnect lines using copper, desirable to use methods that do not depend on patterning the copper lines using a chemical etching process since etching of copper is very difficult and is a process that is only recently being further investigated. The use of copper as a metal for interconnect wiring is further hindered by copper's susceptibility to oxidation. Conventional photoresist processing cannot be used when the copper is to be patterned into various wire shapes because the photoresist needs to be removed at the end of the process by heating it in a highly oxidized environment, such as an oxygen plasma, thereby converting it to an easily removed ash.

Two widely used approaches in creating metal interconnects is the use of the damascene and the dual damascene structures. The application of the Damascene process continues to gain wider acceptance, most notably in the process of copper metalization due to the difficulty of copper dry etch where the Damascene plug penetrates deep in very small, sub-half micron, Ultra Large Scale integrated devices. Recent applications have successfully used copper as a conducting metal line, most notably in the construct of CMOS 6-layer copper metal devices.

In the formation of a damascene structure, a metal plug is first formed in a surface; this surface in most instances is the surface of a semiconductor substrate. A layer of Intra Level Dielectric (ILD) is deposited (using for instance Plasma Enhanced CVD technology with $SiO_2$ as a dielectric) over the surface into which trenches for metal lines are formed (using for instance Reactive Ion Etching technology).

The trenches overlay the metal plug and are filled with metal (using for instance either the CVD or a metal flow process). Planarization of this metal to the top surface of the layer of ILD completes the damascene structure. Some early damascene structures have been achieved using Reactive Ion Etching (RIE) for the process of planarization but Chemical Mechanical Planarization (CMP) is used exclusively today.

An extension of the damascene process is the dual damascene process whereby an insulating or dielectric material, such as silicon oxide, is patterned with several thousand openings for the conductive lines and vias, which are filled at the same time with metal. Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed. One of the dual damascene approaches uses a dielectric layer that is formed by three consecutive depositions whereby the central layer functions as an etch stop layer. This etch stop layer can be SiN, the top and bottom layer of this three layer configuration can be $SiO_2$. This triple layer dielectric allows first forming the vias by resist patterning the vias and etching through the three layers of dielectric. The conductive pattern can then be formed in the top layer of dielectric whereby the central Layer of SiN forms the stop layer for the etch of the conducting pattern. Another approach, still using the three-layer dielectric formed on the substrate surface, is to first form the pattern for the conducting lines in the top layer of the dielectric whereby the SiN layer again serves as etch stop. The vias can then be formed by aligning the via pattern with the pattern of the conducting lines and patterning and etching the vias through the etch stop layer of SiN and the first layer of dielectric. Yet another approach is to deposit the three layer dielectric in two steps, first depositing the first layer of $SiO_2$ and the etch stop layer of SiN. At this point the via pattern can be exposed and etched. The top layer of $SiO_2$ dielectric is then deposited; the conducting lines are now patterned and etched. The SiN layer will stop the etching except where the via openings have already been etched.

Dual damascene is an improvement over single damascene because it permits the filling of both the conductive grooves and vias with metal at the same time, thereby eliminating processing steps. Some of the problems encountered in creating the dual damascene structure relate to the fact that the depth of the interconnect channels is difficult to control due to non-uniform film deposition and the precise control of etch rates during the process of etching the interconnect pattern. This can result in interconnect line profiles that are not uniform across the wafer with deeper line profiles in the center of the wafer and shallower line profiles toward the periphery of the wafer. For smaller device feature holes are required that have small aspect ratios making the filling of the holes with sputtering very difficult. The metals that are typically used for interconnect lines, such as aluminum, copper, gold and silver, can not readily be deposited using CVD technology even though this latter technology does provide better depth of penetration. For materials where CVD can be used for their deposition such as polysilicon and tungsten, these material exhibit higher resistivity as compared to aluminum, copper, gold and silver.

For a dual damascene structure where copper is used as the metal and Ta and/or Ta compounds are used for the barrier layer, the previously indicated dishing of the surface of large trenches and the erosion that occurs on the surface of small structures is, after CMP of the copper surface, very severe due to the extreme difference in polishing rate between copper and Ta-based materials. Ta-based materials have a low chemical mechanical polishing rate due to their hard and chemically inert nature whereas copper has a high chemical mechanical polishing rate due to its soft nature. It is therefore clear that, where copper and Ta-based materials are polished in proximity to each other and as part of the same polishing process, the surfaces of these two material will be affected or polished in an unequal manner resulting in dishing and erosion of the polished copper surface.

The invention provides a method to reduce the indicated dishing and erosion in the surface of the polished copper thereby improving planarity and uniformity of copper trenches in large and small device features.

The invention teaches a method of forming a Cu seed layer over the surface of the Inter Metal Dielectric (IMD) and inside the dual damascene opening, filling the dual damascene opening with a spin-on material such as SOG, etching the seed layer above the IMD, removing the spin-on material, and completing the dual damascene structure with an electroless deposition of Cu in the dual damascene opening. The deposition of a barrier layer and a cap layer is also discussed as part of the invention.

U.S. Pat. No. 5,674,787 (Zhao et al.) shows a selective electroless CU for a damascene interconnection.

U.S. Pat. No. 5,183,795 (Ting et al.) shows a selective electroless process using PR to lift off the seed layer.

U.S. Pat. No. 5,705,430 (Avanzino et al.) shows a dual damascene process with a sacrificial via fill.

U.S. Pat. No. 5,817,572 (Chiang et al.) shows a dual damascene process.

U.S. Pat. No. 5,686,337 (Koh et al.) shows a lower electrode formed by a SOG fill and etch.

SUMMARY OF THE INVENTION

A principle objective of the invention is to reduce surface dishing and erosion in the copper surface of a dual damascene structure.

Another objective of the invention is to improve global planarity and uniformity of the copper surfaces of dual damascene structures.

In accordance with the objectives of the invention a new method is provided for creating a dual damascene structure. A layer of IMD is first deposited over the surface of a substrate. A cap layer is deposited over this layer of IMD, the dual damascene structure (having a via and a trench opening) is then patterned through the cap layer and into the layer of IMD. A tantalum or tungsten or titanium based barrier layer is deposited in the dual damascene structure and over the surface of the cap layer, a copper seed layer is further deposited over the barrier layer. The dual damascene structure is then filled with a spin on material; this spin on material can be fully or partially cured. The tantalum or tungsten or titanium based barrier layer and the copper seed layer are removed above the layer of IMD; the cap layer can be partially removed above the layer of IMD or can be left in place. The spin on material remains in place in the via and trench opening of the dual damascene structure during the latter operation thereby protecting the inside surfaces of these openings during the latter process (of removing the copper seed and the Ta or W or Ti based barrier layer from above the surface of the IMD. The spin-on material is next removed and copper is deposited by selective electroless plating. The cap layer that is still (at least partially) present above the surface of the IMD now protects the IMD dielectric from being contaminated with copper solution during the selective electroless deposition of the copper. The excess copper is removed above the surface of the IMD by a touch-up CMP. The cap layer on the surface of the IMD can, after the copper has been deposited, be removed if this is so desired. As a final step in the process, a liner or oxidation/diffusion protection layer is deposited over the dual damascene structure and its surrounding area.

DESCRIPTION OF THE PREFERRED EMBODIMENTS

Figure 1:
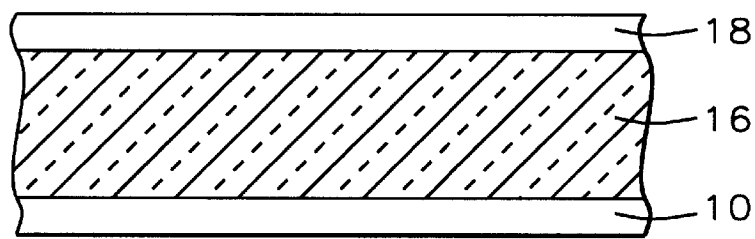
FIG. 1 shows a cross section of a metal surface with a layer of IMD and a cap layer deposited over the layer of metal.

Referring now specifically to FIG. 1, there is shown a cross section of a metal surface 10 over which a layer 16 of Inter Metal dielectric (IMD) has been deposited. A cap layer 18 has been deposited over the layer 16 of IMD.

The requirements for the cap layer are essentially the same as the requirements for a typical copper barrier layer with the understanding that it can be readily removed from the surface of the IMD by either an etch or CMP. A further requirement is that the cap layer be deposited to an adequate thickness, for instance between about 100 and 3000 Angstrom, so that this layer can provide its basic function of protecting the surface of the IMD during subsequent processing steps. The functions of the barrier layer and the copper seed layer have previously been highlighted. That is the copper seed layer serves to promote the selective electroless deposition of copper while the barrier layer prevents diffusion of materials between the dual damascene structure and its adjacent areas during subsequent processing steps.

Figure 2:
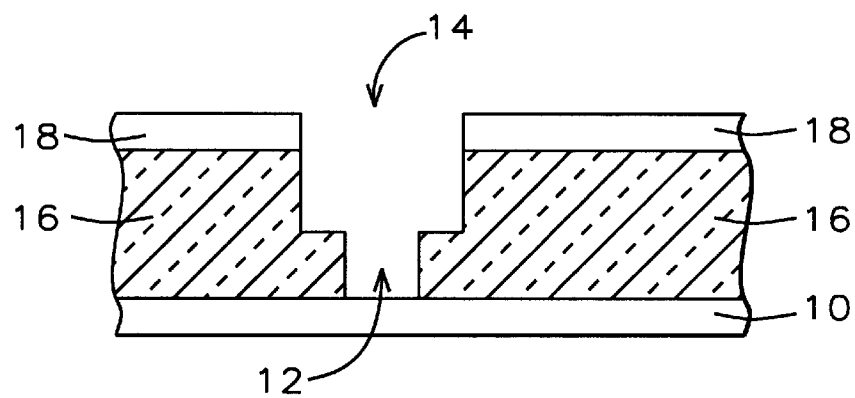
FIG. 2 shows a cross section of the dual damascene structure formed through the cap layer and in the layer of IMD.

FIG. 2 shows a cross section of a dual damascene structure that has been formed through the cap layer 18 and in layer 16 of Inter Metal Dielectric (IMD). The dual damascene structure consists of the via part 12 that is in direct contact with the underlying layer of metal 10 and the interconnect line (or trench) part 14 that overlays the via structure 12.

It must be noted that in the following art work, FIGS. 3a and 3b address the case where the spin-on material is resist while FIGS. 4a and 4b address the case where the spin-on material is SOG or polyimide.

Figure 3A:
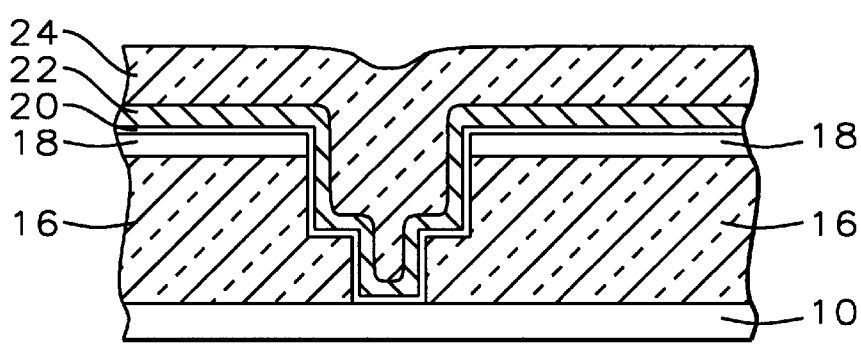
FIG. 3a shows a cross section after the deposition of a barrier layer, a copper seed layer and a resist spin-on material over the dual damascene profile and its surrounding cap layer.

FIG. 3a shows a cross section of the dual damascene structure after the deposition of a barrier layer 20 over which a copper seed layer 22 has been deposited. A spin-on material 24 comprising resist is then deposited over the copper seed layer 22.

Barrier layer 20 is deposited over the sidewalls of the dual damascene and over the surface of the cap layer 18 above the layer 16v of IMD, barrier layer 20 contains a tantalum or tungsten or titanium based material.

The copper seed layer 22 is deposited over the barrier layer 20.

The resist spin-on material 24 is used to fill the complete profile of the dual damascene structure, that is the via part 12 (FIG. 2) and the interconnect line part 14 (FIG. 2). Other spin-on materials can be Spin On Glass (SOG) or polyimide; these latter two spin-on materials are discussed under FIGS. 4a and 4b following. The spin-on material may, during subsequent processing, be partially or completely cured. The function of the spin-on material is to protect the inside surfaces of the dual damascene structure during subsequent processing steps.

Figure 3B:
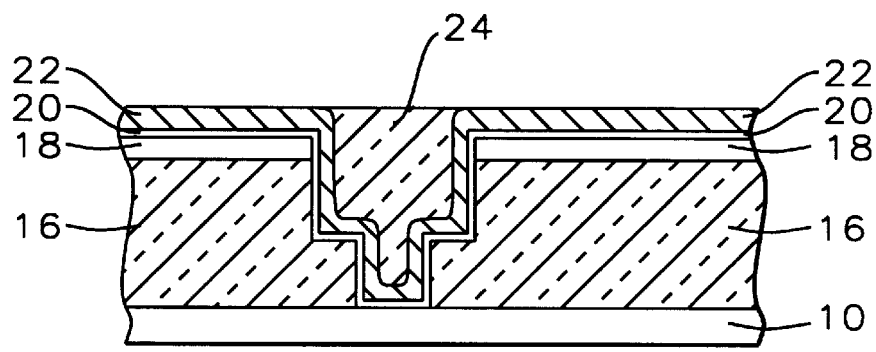
FIG. 3b shows the cross section of FIG. 3a after the removal of the excess resist spin-on material.

FIGS. 3a and 3b reflect that, if the spin-on material 24 is resist, the excess spin-on material 24 on the Cu seed layer 22 and above the layer of IMD (that surrounds the dual damascene opening) is etched away by a plasma dry etch, the plasma can be $O_2$ or $H_2$ based. After this, the copper seed layer 22 and the barrier layer 20 can be removed by an anisotropic dry etch (using a Cl or F-based plasma) with an overetch into cap layer 18. Because resist has high resistance to dry etch, resist 24 protects the underlying copper seed layer 22. An other method is to use $DMSO/CCl_4$ or $HF/CH_3COOH$ to selectively wet etch copper seed layer 22 while HF can selectively etch the tantalum/tungsten/titanium barrier layer 20 without etching much of the resist that is present over the dual damascene structure.

Figure 4A:
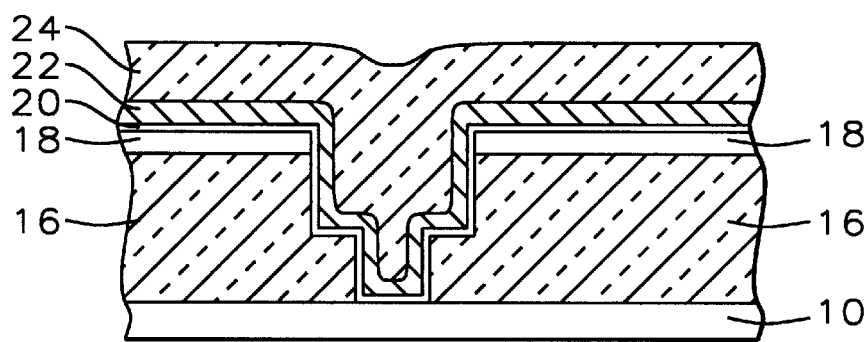
FIG. 4a shows a cross section after the deposition of a barrier layer, a copper seed layer and a SOG or polyimide spin-on material over the dual damascene profile and its surrounding cap layer.
Figure 4B:
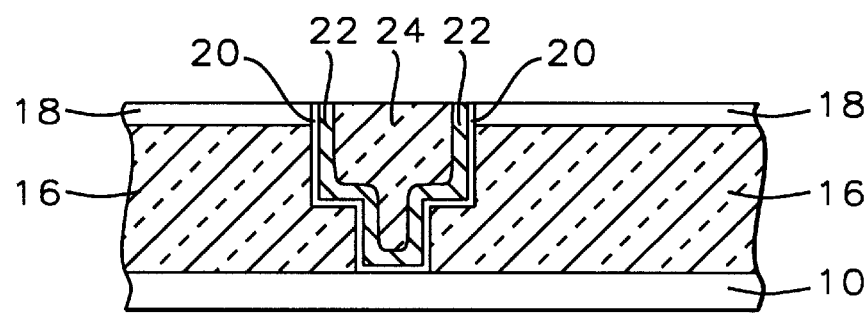
FIG. 4b shows the cross section of FIG. 4a after the barrier layer, the copper seed layer and the spin-on material have been removed from above the surface of the surrounding cap layer (above the IMD)

FIGS. 4a and 4b address the application where the spin-on material is SOG and polyimide. In this case the excess spin-on material 24 above the layer 16 of IMD, the copper seed layer 22 and the barrier layer 20 are removed using CMP. The CMP process can be stopped after over-polish into cap layer 18. Before the polishing process, the structure looks as shown in FIG. 4a, after the polishing process has been completed the structure looks as shown in FIG. 4b. FIG. 4b shows a cross section of the dual damascene structure after the tantalum or tungsten or titanium barrier layer 20 (FIG. 4a), the copper seed layer 22 (FIG. 4a) and the SOG or polyimide based spin-on material 24 (FIG. 4a) have been removed above the cap layer 18.

It is important to note at this time that, during the removal of the copper seed and the barrier layer above the cap layer 18, the spin-on material 24, FIG. 4b, remains in place inside the opening of the dual damascene structure. The spin-on material 24 in this manner provides protection of the copper seed layer 22 inside the dual damascene structure and leaves this seed layer 22 essentially in place. After the copper seed layer 22 and the barrier layer 20 and the spin-on material 24 have been removed from the surface of the cap layer 18, the spin-on material 24 is removed from the inside of the opening as a separate processing step.

The above indicated processing steps of removal of the copper seed layer, the barrier layer and the spin-on material are summarized using the following table. Column #1 shows the spin-on material that is being used, column #2 shows the methods used for the selective removal of the excess spin-on material, the copper seed layer and the barrier layer while column #3 shows the methods used for the final removal of the spin-on material from the opening of the dual damascene structure.

The first entry (row) in column #2 for the resist spin-on material (highlighted with 1)) relates to the removal of the excess spin-on material above the copper seed layer, the second entry in column #2 for the resist spin-on material (highlighted with 2)) relates to the removal of the copper seed and the barrier layers.

| Col. #1 | Col. #2 | Col. #3 |
|---|---|---|
| 1) Resist | 1) dry etch ($O_2/N_2$ or $H_2/N_2$) | dry etch ($H_2/N_2$) |
|  | 2) dry etch (Cl or F) or wet etch ($DMSO/CCl_4$ or $HF/CH_3COOH$) | dry etch ($H_2/N_2$) |
| 2) SOG | CMP | HF/DHF/BOE |
| 3) Polyimide | CMP | dry etch ($H_2/N_2$) |

As a further example are highlighted the processing conditions for the removal of the resist spin-on material above the dual damascene structure: the process is a dry etch (as shown in the table above), the temperature is between about 150 and 300 degrees C., the etchants used have been indicated in the table above, the flow rate is between about 10 and 3000 SCCM with a pressure between about 50 and 10000 mTORR while the time of the process of removal is between about 1 and 5 minutes.

For the removal of the spin-on material from the opening of the dual damascene structure the processing conditions are as follows: the process is a dry etch for the removal of resist and polyimide (as shown in the table above), the temperature is between about 150 and 300 degrees C., the etchant used has been indicated in the table above as $H_2$, the flow rate is between about 10 and 3000 SCCM with a pressure between about 50 and 10000 mTORR while the time of the process of removal is between about 1 second and 5 minutes.

It must also be noted that at this time in the process, that is just before the dual damascene structure is filled with copper, the cap layer 18 is still (at least partially) present above the layer of IMD. This presence of the cap layer 18 above the layer of IMD protects the IMD during the subsequent processing step of filling the dual damascene structure with copper.

Figure 5:
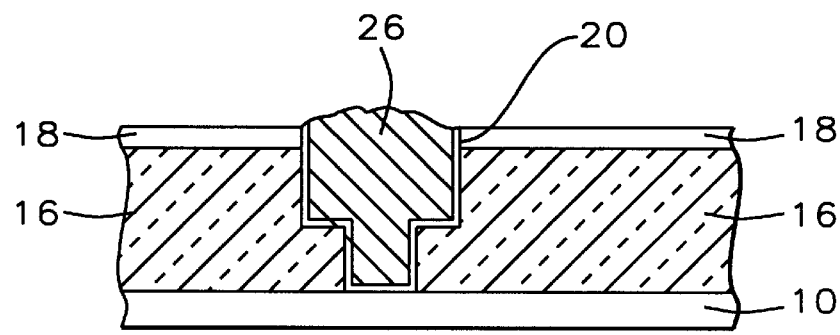
FIG. 5 shows a cross section of the dual damascene structure after selective electroless deposition of copper over the dual damascene structure.

FIG. 5 shows a cross section of the dual damascene structure after the selective electroless deposition of a layer 26 of copper inside the opening for the dual damascene structure.

Key to the invention is that, during this processing step of selective electroless depositing of a layer of copper, the cap layer 18 is in place thereby protecting the surface of the IMD from being contaminated by the copper solution during the plating process.

Figure 6:
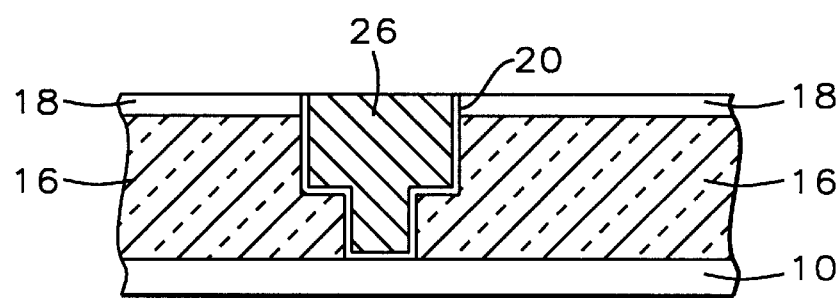
FIG. 6 shows a cross section after the excess copper has been removed from the surface of the surrounding cap layer by a touch-up CMP.

The process of filling the dual damascene structure with copper is an electroless plating process. Electroplating cannot be used for this application since a blanket copper film will form using this method. Selective CVD can also be used for the process of depositing the copper although this approach has as yet not found wide application. Using selective electroless deposition of copper into the dual damascene structure, there is no copper deposition on the area above the IMD that surrounds the dual damascene opening while the copper plug will extend above the surface of the field area, see FIG. 5. By applying a simply touch-up CMP the whole surface will be planarized resulting in a structure as shown in FIG. 6. Dishing or erosion has in this manner been eliminated. Electroplating cannot be used in this case since there is no continuous copper seed layer that can conduct the current.

FIG. 6 shows a cross section after the excess copper has been removed from above the surface of the cap layer 18 down to the level of the top plane of the dual damascene structure 26 by a touch-up CMP.

Figure 7:
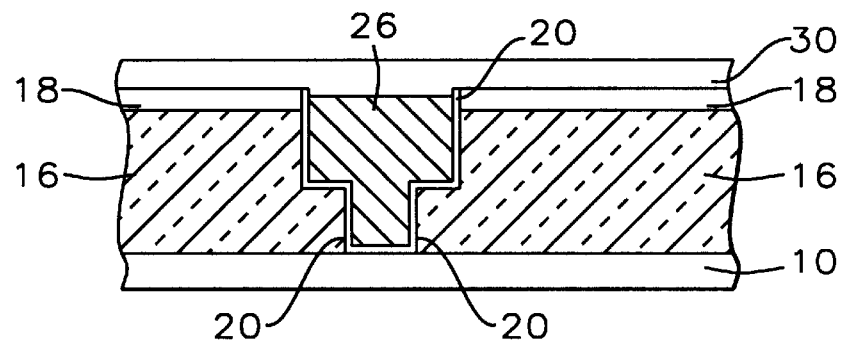
FIG. 7 shows a cross section after the final deposition of an oxidation/diffusion protection layer.

FIG. 7 shows the completion of the dual damascene structure of the invention by the deposition of a layer 30 that serves as a liner and/or copper oxidation/diffusion barrier layer. This layer 30 has been deposited over the cap layer 18, layer 30 serves as a final protective layer for the underlying structure. The liner 30 may contain $Si_3N_4$; layer 30 is typically deposited over the entire surface of the substrate. The cross section as shown in FIG. 7 indicates an application where the cap layer has been lowered (by partial removal) to below the surface of the copper 26 of the dual damascene structure. The layer 30 in this manner covers both the surface of the copper 26 and overlays the cap layer 18.

The Salient Features of the Invention are:
- spin-on material remains in the opening of the dual damascene structure during removal of the spin-on material, the copper seed layer and the barrier layer from above the surface of the cap layer thereby protecting the copper seed layer inside the dual damascene structure
- the formation of a cap layer over the IMD thereby protecting the IMD of copper contamination during selective electroless copper deposition
- the cap layer can be removed after removal of the excess copper or the cap layer can remain in place as extra protection of the underlying IMD
- the cap layer can serve the function of oxidation/diffusion barrier.

Typically, dishing and erosion are due to the high polishing rate of copper as compared to that polishing rate of the barrier metal. With the structure as shown in FIG. 5, in which the copper plug is above the field area, dishing and erosion will not occur.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a copper dual damascene structure on the surface of a semiconductor substrate, comprising the steps of:

providing a semiconductor substrate the surface of said substrate to contain metal contact points;

forming an opening for a dual damascene structure on the surface of said substrate said opening to be formed in a layer of Inter Metal Dielectric (IMD) over which a cap layer has been deposited;

depositing a diffusion barrier layer inside said opening and over the surface of its surrounding area;

depositing a copper seed layer over said diffusion barrier layer;

depositing a spin-on layer over said copper seed layer;

removing said spin-on material from above said opening and from above the surface of said surrounding area thereby leaving in place said spin-on material inside the opening of said dual damascene structure;

removing said copper seed layer from above the surface of said surrounding area;

removing said barrier layer from above the surface of said surrounding area;

removing said spin-on material from said opening of said dual damascene structure;

selectively electroless depositing a layer of copper over said dual damascene opening;

removing excess copper from above the dual damascene opening by a touch-up CMP; and depositing an oxidation/diffusion protection layer over the surface of said dual damascene structure and its surrounding area.

2. The method of claim 1 wherein forming an opening for a dual damascene structure, said structure to contain a via or bottom part and an conducting line or upper part said via part to match and mate with said metal contact points in the surface of said substrate, is:

depositing a first stop layer of SiN over the surface of said substrate said first stop layer to serve as etch stop for the via opening;

depositing a first layer of dielectric on top of said first stop layer said first layer of dielectric to form the inter-metal dielectric layer said first layer to contain $SiO_2$ said first layer of dielectric to serve as the via dielectric;

depositing a second stop layer of PE-CVD SiN on top of said first layer of dielectric said layer of SiN to serve as an second etch stop layer for said conducting line part of said dual damascene structure;

depositing a second layer of dielectric on top of said second stop layer of SiN said second layer of dielectric to serve as interconnect line dielectric;

depositing a cap layer over the surface of said second layer of dielectric;

forming a via pattern in said first layer of dielectric by patterning and etching through said cap layer furthermore etching through said second layer of dielectric furthermore etching through said second stop layer of SiN furthermore etching through said first layer of dielectric;

removing said first stop layer from the bottom of said via pattern thereby forming the via; and forming a conducting line pattern by patterning and etching said cap layer furthermore etching through said second layer of dielectric thereby using said second stop layer of SiN as etch stop layer thereby forming a conducting line pattern.

3. The method of claim 1 wherein said diffusion barrier layer contains material selected from the group comprising Ta and W and Ti and their compounds.

4. The method of claim 1 wherein said spin-on material contains an element selected from the group of Spin On Glass (SOG), a resist, polyimide or any other suitable material whereby furthermore said spin-on material may be partially or completely cured thereby providing protection of the inside surfaces of said dual damascene structure during subsequent processing steps.

5. The method of claim 1 wherein said spin-on layer contains resist whereby:

said removal of said spin-on material from above said opening and from above the surface of said surrounding area is an $O_2$ or $H_2$ based dry etch;

said removal of said copper seed layer from above the surface of said surrounding area is an anisotropic Cl or F based dry etch;

said removal of said barrier layer from above the surface of said surrounding area is an anisotropic Cl or F based dry etch with overetch into said cap layer; and said removal of said spin-on material from said opening of said dual damascene structure is a $H_2$ based dry etch.

6. The method of claim 1 wherein said spin-on layer contains resist whereby:

said removal of said spin-on material from above said opening and from above the surface of said surrounding area is an $O_2$ or $H_2$ based dry etch;

said removal of said copper seed layer from above the surface of said surrounding area is a HF or HF mixture;

said removal of said barrier layer from above the surface of said surrounding area is a selective $DMSO/CCl_4$ or $HF/CH_3COOH$ wet etch with overetch into said cap layer; and said removal of said spin-on material from said opening of said dual damascene structure is a $H_2$ based dry etch.

7. The method of claim 1 wherein said spin-on layer contains SOG whereby:

said removal of said spin-on material from above said opening and from above the surface of said surrounding area is a CMP process;

said removal of said copper seed layer from above the surface of said surrounding area is a CMP process;

said removal of said barrier layer from above the surface of said surrounding area is a CMP process with overetch into said cap layer; and said removal of said spin-on material from said opening of said dual damascene structure is a HF or DHF or BOE based etch.

8. The method of claim 1 wherein said spin-on layer contains polyimide whereby:

said removal of said spin-on material from above said opening and from above the surface of said surrounding area is a CMP process;

said removal of said copper seed layer from above the surface of said surrounding area is a CMP process;

said removal of said barrier layer from above the surface of said surrounding area is a CMP process with overetch into said cap layer; and said removal of said spin-on material from said opening of said dual damascene structure is a $H_2$ based dry etch.

9. The method of claim 1 wherein said depositing a layer of copper is a selective electroless plating process.

10. The method of claim 1 wherein said depositing a layer of copper is a selective CVD process.

11. The method of claim 1 wherein said removing excess metal from the surface of said second layer of dielectric is further extended to continue said removal below the surface of said barrier layer and to thereby partially remove said barrier layer in a planar manner from the surface of said second layer of dielectric.

12. The method of claim 1 wherein said removal of excess copper from the surface of said second layer of dielectric is by touch-up CMP.

13. The method of claim 1 wherein said depositing an oxidation/diffusion protection layer over the surface of said layer of IMD is depositing a layer of $Si_3N_4$ or any other suitable material that can provide protection of a copper surface against oxidation and/or chemical or mechanical damage.

* * * * *